(12) United States Patent
Kadota

(10) Patent No.: US 6,606,333 B2
(45) Date of Patent: *Aug. 12, 2003

(54) SEMICONDUCTOR PHOTONIC DEVICE

(75) Inventor: Michio Kadota, Kyoto (JP)

(73) Assignee: Murata Manufacturing Co., Ltd., Kyoto (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/340,306

(22) Filed: Jun. 28, 1999

(65) Prior Publication Data

US 2002/0126719 A1 Sep. 12, 2002

(30) Foreign Application Priority Data

Jul. 10, 1998 (JP) .............................. 10-196069
Jul. 10, 1998 (JP) .............................. 10-196073

(51) Int. Cl.$^7$ ................................................ H01S 5/00
(52) U.S. Cl. ...................................................... 372/45
(58) Field of Search ....................... 372/45, 46; 257/94, 257/96, 97, 103

(56) References Cited

FOREIGN PATENT DOCUMENTS

| DE | 4207783 | 3/1992 |
|---|---|---|
| DE | 19629720 | 7/1996 |
| JP | 8-050815 | 2/1996 |
| JP | 08139361 | 5/1996 |
| JP | 945960 | 2/1997 |
| JP | 9-129923 | 5/1997 |
| JP | 9293936 | 11/1997 |

OTHER PUBLICATIONS

K. Minegishi, et al. "Growth of p–type Zinc Oxide Films by Chemical Vapor Deposition", Jpn. J. Appl. Phys., vol. 36 (1997), pp. L 1453 to L 1455. Nov.

*Primary Examiner*—Quyen Leung
(74) *Attorney, Agent, or Firm*—Keating & Bennett, LLP

(57) ABSTRACT

A semiconductor photonic device includes: a substrate; a ZnO buffer layer provided on the substrate; and an $In_xGa_yAl_zN$ compound semiconductor layer provided on the ZnO layer, where $x+y+z=1$, $0 \leq x \leq 1$, $0 \leq y \leq 1$, $0 \leq z \leq 1$, and wherein the ZnO buffer layer excludes, as a constituent element, an element of the $In_xGa_yAl_zN$ compound semiconductor. Preferably, the ZnO buffer layer is doped with B, Sc, Y, La, Ac, Tl, V, Nb, Ta, P, As, Sb or Bi.

5 Claims, 4 Drawing Sheets

SEMICONDUCTOR PHOTONIC DEVICE

BACKGROUND OF THE INVENTION

1. Field of the Invention

The present invention relates to a semiconductor photonic device, and more particularly to a semiconductor photonic device having a GaN-based compound semiconductor layer as an active layer.

2. Description of the Related Art

As materials for semiconductor photonic devices, such as a light emitting diode (LED), a laser diode (LD), and the like which emit blue light or ultraviolet rays, known are Group III–V compound semiconductors which have a general formula of $In_xGa_yAl_zN$ where $x+y+z=1$, $0 \leq x \leq 1$, $0 \leq y \leq 1$, and $0 \leq z \leq 1$. The compound semiconductors are collectively referred to as GaN-based compound semiconductors. Since the GaN-based compound semiconductors are of a direct transition type, photonic devices using the GaN-based compound semiconductors have a high light emitting efficiency, and their light emitting wave lengths can be easily controlled with the concentration of In. Accordingly, as a light emitting element material, great attention has been attracted to the compound semiconductors.

In spite of the promising feature of the photonic devices using the GaN-based compound semiconductors, such photonic devices are still difficult to be realized for practical use. This is because it is very difficult to produce a single crystal of the GaN-based compound semiconductors having a large diameter.

In order to solve the problem, employed is a so-called hetero-epitaxial growth method by which the single crystal of the GaN-based compound semiconductor is grown on a substrate made of a material different from the GaN-based compound semiconductor. In addition, it has been proposed to use a ZnO layer as a buffer layer between the substrate and the GaN-based semiconductor layer to be grown on the substrate.

For example, Japanese Unexamined Patent Publication No. 9-45960 discloses semiconductor light-emitting device in which a ZnO layer doped with Al is provided between an InGaAlN layer and a silicon substrate. Japanese Unexamined Patent Publication No. 9-296936 discloses a laser diode in which a ZnO layer doped with Al is provided between a sapphire substrate and GaN layer. In these devices, the ZnO layer is doped with Al so that the ZnO layer has a conductivity.

Although it is stated in these documents that these devices have an improved long life time, it is found by the inventor that these devices suffer from the problem that the light-emitting characteristics and physical properties gradually change during operation.

SUMMARY OF THE INVENTION

The present invention is directed to a photonic device that can solve the aforementioned problem. The semiconductor photonic device comprises: a substrate; a ZnO buffer layer provided on the substrate; and an $In_xGa_yAl_zN$ compound semiconductor layer provided on the ZnO layer, where $x+y+z=1$, $0 \leq x \leq 1$, $0 \leq y \leq 1$, $0 \leq z \leq 1$, and wherein the ZnO buffer layer excludes, as a constituent element, an element of the $In_xGa_yAl_zN$ compound semiconductor.

The ZnO buffer layer preferably excludes Al, In and Ga and is doped with at least one element selected from the group consisting of B, Sc, Y, La, Ac, Tl, V, Nb, Ta, P, As, Sb and Bi.

The ZnO buffer layer has preferably a specific resistance of 10 Ω·cm or less.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

According to the present invention it has been found that the aluminum doped in the ZnO layer diffuses to the GaN-based layer in contact with the ZnO layer so as to adversely change the composition or composition ratio of the GaN-based layer and cause changes in light-emitting characteristics and physical properties.

In view of the foregoing reasons, the semiconductor photonic device of the present invention comprises a substrate, a low resistance ZnO buffer layer formed on the substrate and a compound semiconductor layer formed of a material expressed by $In_xGa_yAl_zN$ where $x+y+z=1$, $0 \leq x \leq 1$, $0 \leq y \leq 1$, $0 \leq z \leq 1$, formed on the ZnO buffer layer, wherein the ZnO buffer layer excludes, as a constituent element, an element of the compound semiconductor layer.

Preferably, the compound semiconductor layer excludes Al, In, and Ga as an impurity element or a dopant. Instead, it is preferable that the ZnO buffer layer is doped with at least one element selected from the group consisting of B, Sc, Y, La, Ac, Tl, V, Nb, Ta, P, As, Sb, and Bi, which are Group III or V elements.

According to the present invention, no constituent element of the compound semiconductor layer, which is an upper layer of the ZnO buffer layer, is doped in the ZnO buffer layer. Thus, there is no diffusion of an impurity element from the ZnO buffer layer to the compound semiconductor upper-layer to change the composition of the compound semiconductor upper-layer. Accordingly, the physical and optical characteristics of the light emitting element can be enhanced.

In addition, according to the present invention, when the ZnO buffer layer is doped with the aforementioned elements, the crystallinity and orientation property of the ZnO buffer layer are improved. As a result, the crystallinity of the $In_xGa_yAl_zN$ compound semiconductor layer formed on the ZnO buffer layer is also improved.

The substrate used on the photonic device of the present invention may be a Si substrate having a low resistivity or an insulating substrate. In the case where the substrate is made of Si having a low resistance, the ZnO buffer layer with a low resistance is formed on the conductive Si substrate. Thus, electrodes can be provided on the upper and lower faces of the photonic device. As a result, the structure of the photonic device can be simplified.

In the case where the substrate is an insulating material, a lower electrode may be provided on the surface of the ZnO buffer layer.

Hereinafter, the preferred embodiments of the present invention are explained in more detail with reference to the drawings.

First Embodiment

Figure 1:
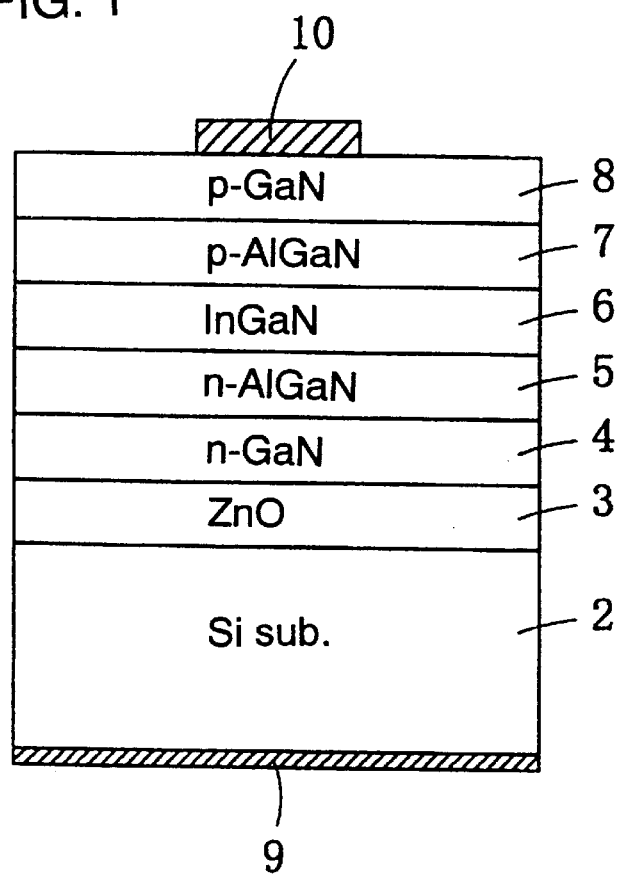
FIG. 1 is a schematic cross sectional view of a semiconductor photonic device according to a first embodiment of the present invention.

FIG. 1 is a schematic cross sectional view of a semiconductor photonic device 1 according to a first embodiment of the present invention. The semiconductor photonic device 1 is a light-emitting diode having a double heterojunction structure in which an InGaN layer 6 is a light emitting layer or an active layer. In the semiconductor photonic device 1, a ZnO buffer layer 3 having a low specific resistance is grown on a Si substrate 2 having a low resistance. On the ZnO buffer layer 3, an n-type GaN layer 4, an n-type AlGaN layer 5, an InGaN layer 6, a p-type AlGaN layer 7, and a p-type GaN layer 8 are epitaxially grown sequentially. The n-type GaN layer 4, the n-type AlGaN layer 5, the InGaN layer 6, the p-type AlGaN layer 7, and the p-type GaN layer 8 make up the double heterojunction structure. Further, an n-type electrode 9 is formed on the whole of the lower surface of the Si substrate 2. A p-type electrode 10 is formed partially on the upper face of the p-type GaN layer 8.

The Si substrate 2 can have a specific resistance of about 10 Ω·cm or lower. However, it is preferable that the Si substrate 2 have a specific resistance of up to 1 Ω·cm. The specific resistance of the ZnO buffer layer 23 is set at 10 Ω·cm or less, preferably at 5 Ω·cm or less, and more preferably at 1 Ω·cm or less by doping an impurity element. As described above, the Si substrate 2 and the ZnO buffer layer 3 have a low resistance. Accordingly, if a DC voltage is applied between the p-type electrode 10 and the n-type electrode 9 provided on the upper and lower faces of the light emitting element 1, current flows between the p-type electrode 10 and the n-type electrode 9 through the Si substrate 2 and the ZnO buffer layer 3, so that the current is injected from the p-type electrode 10 into the InGaN layer 6 for light emission. The light from the InGaN layer 6 exits from the light-emitting element in the area in the upper face of the p-type GaN layer 8 where the p-type electrode 10 is not formed.

As seen in the above-description, the p-type and n-type electrodes 10 and 9 can be provided on the upper and lower faces of the photonic device 1. The photonic device 1 has the structure that the respective compound semiconductor layers and both the electrodes are simply laminated in series with each other. Thus, the structure can be simplified. In addition, at mounting, the n-type electrode 9 on the lower face can be die-bonded to a circuit substrate. Thus, the mounting onto the circuit substrate can be simplified. Further, the device can be miniaturized as compared with a structure in which both electrodes are provided on the upper side of a substrate, as in the use of a c-plane oriented sapphire substrate.

The impurity element (dopant) which is used to dope the ZnO buffer layer 3 to reduce the resistance thereof is an element not contained in the upper layers, that is, it is an element not contained in the compound semiconductor layers. In the instant embodiment, the element is a Group III or V element excluding Ga, Al, and In. That is, as the Group III element, B, Sc, Y, La, Ac, Tl, or the like can be used as a dopant. As the Group V element, V, Nb, Ta, P, As, Sb, Bi, or the like can be doped. Because the resistance of the ZnO buffer layer 3 is reduced by doping using an impurity element which is not contained in the compound semiconductor upper-layer, the composition of each compound semiconductor layer is inhibited from being changed even if the impurity in the ZnO buffer layer 3 is diffused in the upper compound semiconductor layer. Thus, the physical and optical properties of the light emitting element can be stabilized.

Figure 2:
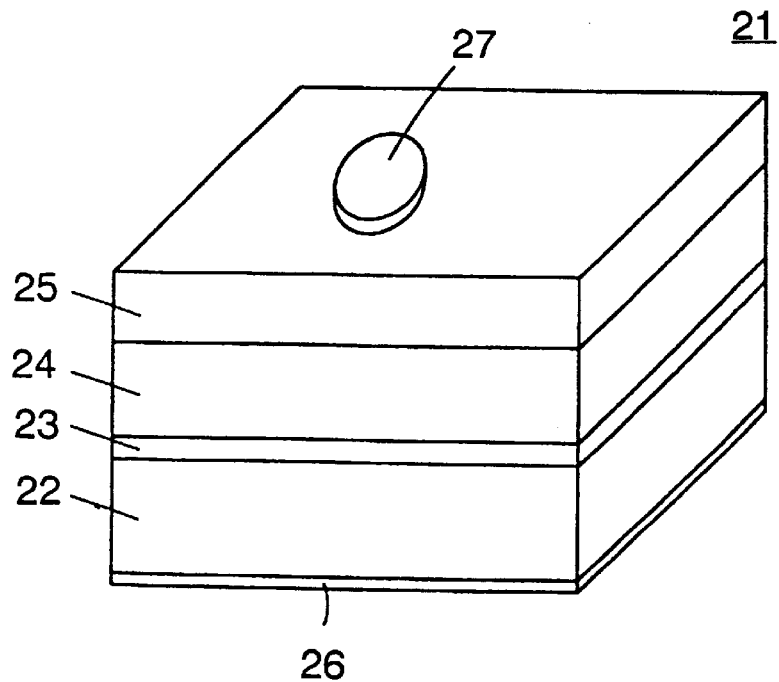
FIG. 2 is a perspective view showing a variation of the photonic device according to the first embodiment.

The present invention can be applied to elements other than the semiconductor photonic device having the double heterojunction structure containing the InGaN layer 6 as shown in FIG. 1. For example, a photonic device, such as a semiconductor photonic device 21 shown in FIG. 2 may be employed. In the semiconductor photonic device 21, a ZnO buffer layer 23 with a low resistance, an n-type GaN layer 34, and a p-type GaN layer 25 are stacked on to a Si substrate 22 having a low resistance. An n-type electrode 26 is formed on the lower face of the Si substrate 22, and a p-type electrode 27 is provided on the p-side GaN layer 25.

Figure 3:
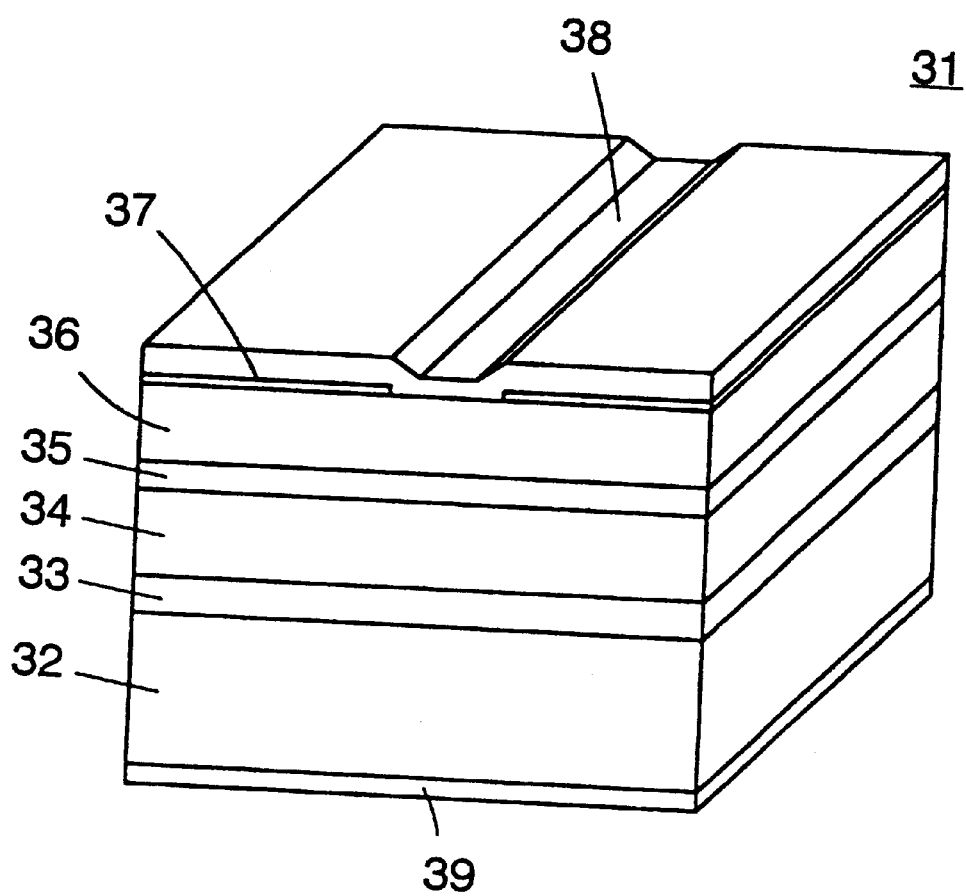
FIG. 3 is a perspective view showing another variation of the photonic device according to the first embodiment.

Moreover, a semiconductor photonic device element 31, such as a laser diode, an edge emitting type light emitting diode, and the like may be employed, in which, as shown in FIG. 3, a ZnO buffer layer 33 with a low resistance is formed on a Si substrate 32 and an n-type GaN clad layer 34, a p-type GaN active layer 35, and a p-type GaN clad layer 36 are laminated thereover. An SiO$_2$ film 37 is formed on the upper face area excluding the center portion of the p-type GaN clad layer 36, a p-type electrode 48 is provided on the p-type GaN clad layer 36, covering the SiO$_2$ film 37, and an n-type electrode 39 is provided on the lower face of the Si substrate 32. In this case, a Group III or V element excluding Ga is doped into the ZnO buffer layer as an impurity.

Second Embodiment

Figure 4:
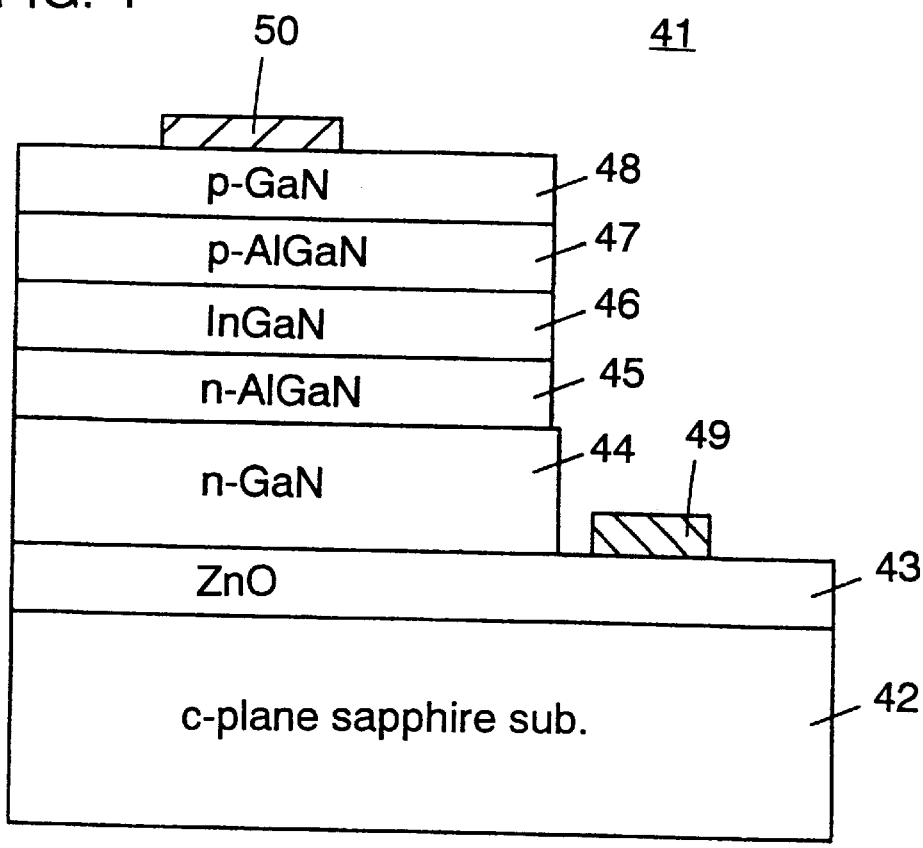
FIG. 4 is a schematic cross sectional view of a semiconductor photonic device according to a second embodiment of the present invention.

FIG. 4 is a schematic cross sectional view of a semiconductor photonic device 41 according to the second embodiment of the present invention. The semiconductor photonic device 41 is a light emitting diode or a laser diode having a double hetero-junction structure in which an InGaN layer 46 functions as a luminescent layer. In the semiconductor photonic device 41, a ZnO buffer layer 43 having low resistivity is deposited on an insulating c-plane oriented sapphire substrate 42, and on the ZnO buffer layer 43, an n-type GaN layer 44, an n-type AlGaN layer 45, the InGaN layer 46, a p-type AlGaN layer 47, and a p-type GaN layer 48 are epitaxially deposited in that order. The n-type GaN layer 44, the n-type AlGaN layer 45, the InGaN layer 46, the p-type AlGaN layer 47, and the p-type GaN layer 48 constitute a double hetero-junction structure. After the ZnO buffer layer 43 to the p-type GaN layer 48 are formed on the sapphire substrate 42, the n-type GaN layer 48 to the n-type GaN layer 44 to the p-type GaN layer 44 are partially removed by etching to expose the ZnO buffer layer 43. A lower electrode 49 is provided on the upper surface of the ZnO buffer layer 43, and an upper electrode 40 is formed on the upper surface of the p-type GaN layer 48.

There is an appreciable difference in lattice constants between sapphire and GaN, and it is difficult to form the n-type GaN layer 44 having good crystallinity on the sapphire substrate 42; however, since a ZnO thin film has a crystal constant close to that of a GaN film, by orienting the ZnO buffer layer 43 in the c-axis direction or in the (11$\bar{2}$0) plane of the sapphire substrate 42, and by epitaxially depositing the n-type GaN layer 24 and the like on the ZnO buffer layer 13, the n-type GaN layer 24 and the like having good crystallinity are formed.

The resistivity of the ZnO buffer layer 23 is set at 10 Ω·cm or less, preferably at 5 Ω·cm or less, and more preferably at 1 Ω·cm or less by doping impurity elements. Although the sapphire substrate 42 has insulating properties, since the ZnO buffer layer 43 has low resistance and is partially exposed for forming an electrode, when a direct-current voltage is applied between the upper electrode 50 provided on the p-type GaN layer 48 and the lower electrode 49 provided on the ZnO buffer layer 43, an electric current flows between the upper electrode 50 and the lower electrode 49 through the ZnO buffer layer 43, the InGaN layer 46 emits light because of an injected electric current, and the light emitted from the InGaN layer 46 is emitted to the exterior from the region in which the upper electrode 50 is not provided on the upper surface of the p-type GaN layer 48.

Herein, impurity elements (dopants) which are used to dope the ZnO buffer layer 43 to reduce the resistance thereof are elements which are not contained in the upper compound semiconductor layers, and in this embodiment, Group III elements or Group V elements excluding Ga, Al, and In are used. That is, as Group III elements, B, Sc, Y, La, Ac, Tl, or the like may be used as dopants, and as Group V elements, V, Nb, Ta, P, As, Sb, Bi, or the like may be used. When the resistance of the ZnO buffer layer 43 is reduced by doping impurity elements which are not contained in the upper compound semiconductor layers into the ZnO buffer layer 43, even if impurities in the ZnO buffer layer 43 diffuse into the upper compound semiconductor layers, the composition of the individual compound semiconductor layers is not easily changed, thus enabling stabilization of physical properties and optical properties of the light emitting device.

Figure 5:
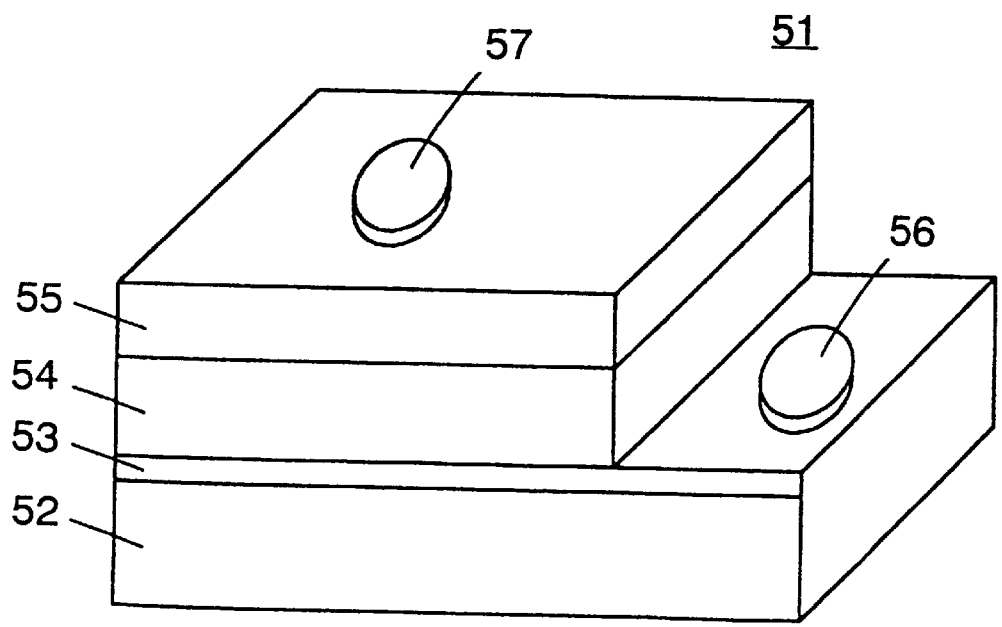
FIG. 5 is a perspective view showing a variation of the photonic device according to the second embodiment.

The present invention is also applicable to other semiconductor photonic devices in addition to a semiconductor photonic device having a double hetero-junction structure using the InGaN layer 46 as shown in FIG. 5. For example, a semiconductor photonic device 51 shown in FIG. 5 may be acceptable, in which a ZnO buffer layer 53 having low resistance, an n-type GaN layer 54, and a p-type GaN layer 55 are deposited on a sapphire substrate 52, a lower electrode 56 is formed on the upper surface of the ZnO buffer layer 53, and an upper electrode 57 is provided on the p-type GaN layer 55.

Figure 6:
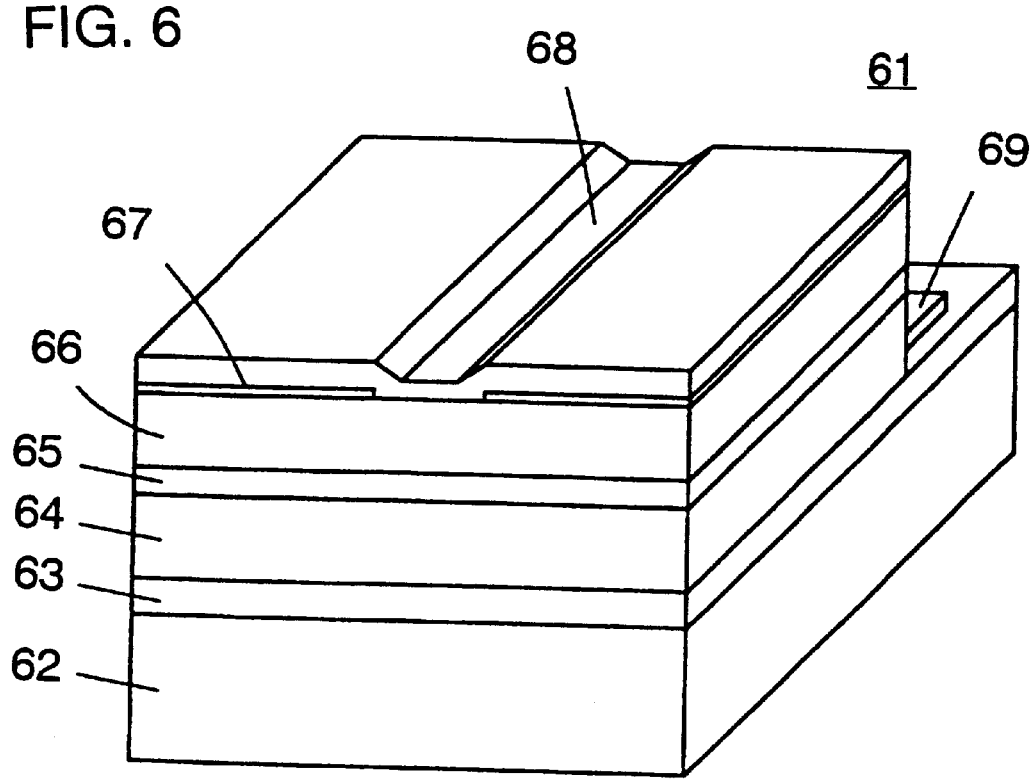
FIG. 6 is a perspective view showing another variation of the photonic device according to the second embodiment.

Furthermore, as shown in FIG. 6, a semiconductor photonic device 61 such as a laser diode or a facet emitting light emitting diode may be acceptable, in which a ZnO buffer layer 63 having low resistance is formed on a sapphire substrate 62, an n-type GaN cladding layer 64, a p-type GaN active layer 65, and a p-type GaN cladding layer 66 are deposited, a specular surface is formed by dicing, an $SiO_2$ film 67 is formed in the region of the upper surface of the p-type GaN cladding layer 66 excluding a central area, an upper electrode 68 is provided from on the $SiO_2$ film 67 to on the p-type GaN cladding layer 66, and a lower electrode 69 is provided on the lower surface of the sapphire substrate 62. In such cases, Group III elements excluding Ga or Group V elements as impurities are doped into ZnO buffer layers.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A semiconductor photonic device comprising:

a silicon substrate having low resistivity;

a ZnO buffer layer provided on the substrate; and an $In_xGa_yAl_zN$ compound semiconductor layer provided on the ZnO layer, where x+y+z=1, $0 \leq x \leq 1$, $0 \leq y \leq 1$, $0 \leq z \leq 1$, and wherein the ZnO buffer layer does not include, as a dopant, any element of the $In_xGa_yAl_zN$ compound semiconductor.

2. A semiconductor photonic device according to claim 1, wherein the ZnO buffer layer is doped with at least one element selected from the group consisting of B, Sc, Y, La, Ac, Tl, V, Nb, Ta, P, As, Sb and Bi.

3. A semiconductor photonic device according to claim 2, wherein the ZnO buffer layer has a specific resistance of 10 Ω·cm or less.

4. A semiconductor photonic device according to claim 1, further comprising an electrode formed on the ZnO buffer layer.

5. A semiconductor photonic device according to claim 1, further comprising an electrode formed on the substrate.

* * * * *